United States Patent [19]

Stiegler

[11] Patent Number: 5,528,543
[45] Date of Patent: Jun. 18, 1996

[54] SENSE AMPLIFIER CIRCUITRY

[75] Inventor: Harvey J. Stiegler, Houston, Tex.

[73] Assignee: Texas Instruments Incorporated, Dallas, Tex.

[21] Appl. No.: 307,137

[22] Filed: Sep. 16, 1994

[51] Int. Cl.$^6$ .............................. G11C 7/06; H03K 3/01
[52] U.S. Cl. ........................ 368/207; 365/210; 327/52; 327/53
[58] Field of Search .................................. 365/207, 210, 365/208, 203; 327/51, 52, 53

[56] References Cited

U.S. PATENT DOCUMENTS

| | | | |
|---|---|---|---|
| 4,654,831 | 3/1987 | Uenuatesh | 365/210 |
| 4,974,207 | 11/1990 | Hashimoto | 365/207 |
| 5,157,626 | 10/1992 | Watanabe | 365/210 |
| 5,305,273 | 4/1994 | Jinbo | 365/210 |
| 5,386,158 | 1/1995 | Wang | 365/210 |

*Primary Examiner*—Tan T. Nguyen
*Attorney, Agent, or Firm*—Theodore D. Lindgren; Leo N. Heiting; Richard L. Donaldson

[57] ABSTRACT

Sense amplifier circuitry (SC) includes a differential amplifier (A) having a reference input and a memory input. The output of a first sense amplifier (SA1) is coupled to the reference input of the differential amplifier (A) and to the input of a second sense amplifier (SA2). The output of the second sense amplifier (SA2) is coupled to the memory input of the differential amplifier (A) and to the input of the first sense amplifier (SA1). The first sense amplifier (SAR) and the second sense amplifier (SA2) include identical mirror transistor circuits (M1, M2, M3, M4).

14 Claims, 3 Drawing Sheets

SENSE AMPLIFIER CIRCUITRY

BACKGROUND OF THE INVENTION

The present invention relates to integrated-circuit memory arrays, including erasable programmable read-only-memory (EPROM or flash EPROM) arrays. In particular, the invention relates to sensing of currents during reading of such memories to determine whether or not a particular cell is programmed with a "1" or a "0".

An example of prior-art sensing circuitry is described in "A 29s 8 Mb EPROM with Dual Reference-Column ATD Sensing", Sweha et al., ISSCC 1991 (p. 264–265). A pseudodifferential sense amplifier using an equalization technique is discussed in "A 36ns 1 Mbit CMOS EPROM With New Data Sensing Technique", Nakai et al., 1990 Symposium on VLSI Circuits (p. 95–96).

U.S. Pat. Nos. 5,056,063; 5,126,974 and 5,206,552 disclose methods of improving the speed of current-mirror-type sense amplifiers including, in one of those example patents, use of differential amplifiers with positive feedback.

An EPROM cell typically comprises a floating-gate field-effect transistor. The floating-gate conductor of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate conductor of a non-programmed cell is neutrally charged (or slightly positively or negatively charged) such that the source-drain path under the non-programmed floating gate is conductive when the predetermined voltage is applied to the control gate. The conductive state is read by a sense amplifier as a "one" bit.

An EPROM array may contain millions of floating-gate memory cells arranged in rows and columns. The sources of each cell in a column are connected to a source-column line and the source-column line for a selected cell may be connected to reference potential or ground during reading of the selected cell by a sense amplifier. The drains of each cell in a column are connected to a separate bitline (drain-column line) and the drain-column line for a selected cell is connected to the input of the sense amplifier during reading of the selected cell. The control gates of each cell in a row are connected to a wordline, and the wordline for a selected cell is connected to the predetermined select voltage during reading of the selected cell.

During the read operation, the current through the selected cell is compared with a reference current to determine whether or not the selected cell is programmed with a "0" or a "1". The reference current is derived from reference circuitry, which may include one or more floating-gate cells identical to the cell being read or may include a column of such reference cells. The reference circuitry is connected to input of a first current-sensing amplifier. The output of the first current-sensing amplifier is connected to one side of a differential amplifier. The differential amplifier compares the voltage output of the first current-sensing amplifier with the voltage output of a second sensing amplifier connected to the selected memory cell being read. If the reference-circuitry comprises a memory cell that is essentially the same as the memory cell being read, it is generally necessary to unbalance the current-sensing amplifiers in order to arrive at a reference current between the current of selected cells programmed with a "0" and the current of selected cell programmed with a "1". In such prior-art sense amplifiers, in addition to the current-sensing amplifiers being unbalanced, but the loads connected to those current-sensing amplifiers are also unbalanced because the capacitance associated with the reference-circuitry differs from the capacitance associated with the memory cell being read. The difference in capacitance is generally either related to different bitline lengths and/or to the associated interconnect geometries.

Problems associated with such prior-art sensing methods include slow sensing speed and noise susceptibility. The slow sensing speed results primarily from the capacitance of the bitlines. There is a need for sense amplifier circuitry that increases sensing speed and decreases noise susceptibility.

SUMMARY OF THE INVENTION

The sense amplifier circuitry of this invention uses a fully balanced circuit with cross-coupled feedback and equalization to solve the foregoing problems. The cross-coupled feedback, along with balanced capacitive loading, increases the sensing speed. The balanced circuitry improves rejection of, or immunity to, on-chip-generated noise because of a better common-mode rejection ratio.

The sense amplifier circuitry includes a differential amplifier having a reference input and a memory input. The output of a first sense amplifier is coupled to the reference input of the differential amplifier and to the input of a second sense amplifier. The output of a second sense amplifier is coupled to the memory input of the differential amplifier and to the input of the first sense amplifier. The first sense amplifier and the second sense amplifier include identical mirror transistor circuits.

DETAILED DESCRIPTION OF THE INVENTION

Figure 1:
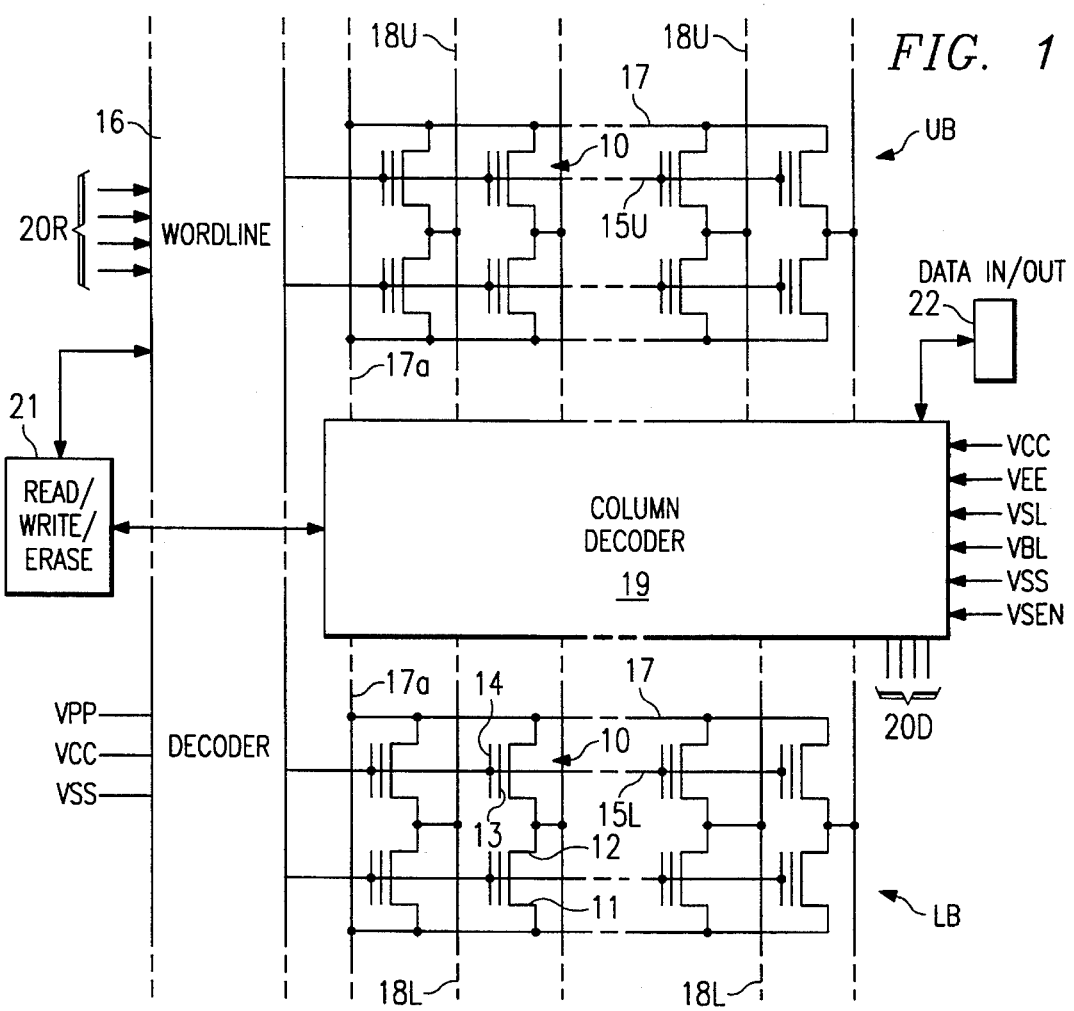
FIG. 1 is an electrical schematic diagram, in partial block form, of a flash memory.

Referring to FIG. 1, an example array of memory cells, which is an integral part of a memory chip, is shown for the purpose of illustrating use of the method and circuitry of this invention. The array is divided, for example, into an upper block UB and a lower block LB of cells 10. Each cell 10 is a floating-gate transistor having a source 11, a drain 12, a floating gate 13, a control gate 14. Each of the control gates 14 in a row of cells 10 is connected to a wordline 15U or 15L, and each of the wordlines 15U or 15L is connected to a wordline decoder 16. Each of the sources 11 in a row of cells 10 is connected to a source line 17. Each of the drains 12 in a column of cells 10 is connected to a drain-column line 18U or 18L. Each of the source lines 17 is connected by a common-column line 17a to a column decoder 19 and each of the drain-column lines 18U or 18L is connected to the column decoder 19.

In the read mode, the wordline decoder 16 functions, in response to wordline address signals on lines 20R and to signals from Read/Write/Erase control circuit 21 (or microprocessor 21), to apply a preselected positive voltage VCC (approx. +5 V) to the selected wordline 15U or 15L, and to apply a low voltage (ground or VSS) to deselected wordlines 15U and/or 15L. The column decoder 19 functions to apply a preselected positive voltage VSEN (approx. +1 V) to at least the selected drain-column line 18U or 18L and to apply a low voltage (approximately 0 V) to the source line 17. The column decoder 19 also functions, in response to signals on address lines 20D, to connect the selected drain-column line 18U or 18L of the selected cell 10 to the DATA IN/OUT terminal 22. The conductive or nonconductive state of the cell 10 connected to the selected drain-column line 18U or 18L and the selected wordline 15U or 15L is detected by sensing circuitry that furnishes a signal to the DATA IN/OUT terminal 22. That sensing circuitry is the subject of this invention.

During a flash-erase mode, the column decoder 19 functions to leave all drain-column lines 18U and/or 18L floating (connected to a high impedance such as field-effect transistor biased in "OFF" condition). The wordline decoder 16 functions to connect all the wordlines 15U and/or 15L to VSS, which may be ground or 0 V. The column decoder 19 also functions to apply a positive voltage VEE (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15U or 15L is at reference voltage VSS, the cell 10 remains in the nonconducting state during erase.

In a write or program mode, the wordline decoder 16 may function, in response to wordline address signals on lines 20R and to signals from Read/Write/Erase control circuit 21, (or microprocessor 21 ) to place a preselected first programming voltage VPP (approx. +12 V) on a selected wordline 15U or 15L, including a selected control-gate 14. Column decoder 19 also functions to place a second programming voltage VBL (approx. +5 to +10 V) on a selected drain-column line 18U or 18L and, therefore, the drain 12 of selected cell 10. Source lines 17 are connected to reference potential VSS, which may be ground. All of the deselected drain-column lines 18U and/or 18L are connected to reference potential VSS or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with the control gate 14 at 0 V). For memory cells 10 fabricated in accordance with the example embodiment, the coupling coefficient between a control gate 14/wordline 15U or 15L and a floating gate 13 is approximately 0.6. Therefore, a programming voltage VPP of 12 V, for example, on a selected wordline 15U or 15L, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 noncon-ductive with +5 V on its control gate, a state which is read as a "zero" bit. Non-programmed cells 10 have source-drain paths under the floating gate 13 that are conductive with +5 V on their control gates, and those cells 10 are read as "one" bits.

For convenience, a table of read, write and erase voltages is given in TABLE I below:

TABLE I

|  | Read | Flash Erase | Program |
| --- | --- | --- | --- |
| Selected Wordline | 5 V | 0 V (All) | +12 V |
| Deselected Wordlines | 0 V | — | 0 V |
| Selected Drain Line | 1.0 V | Float (All) | +5 V to +10 V |
| Deselected Drain Lines | 0 V/Float | — | Float |
| Source Lines | 0 V | +10 V or +15 V | 0 V |

As stated above, the circuitry of this invention may be a part of column decoder 19 of a nonvolatile or other memory device such as that shown in FIG. 1. In response to voltages applied to specific wordlines 15U or 15L and drain column-lines 18U or 18L the sensing circuitry transmits a signal to DATA IN/OUT terminal 22 indicating whether a particular cell 10 is programmed with a "0" or a "1".

Figure 2:
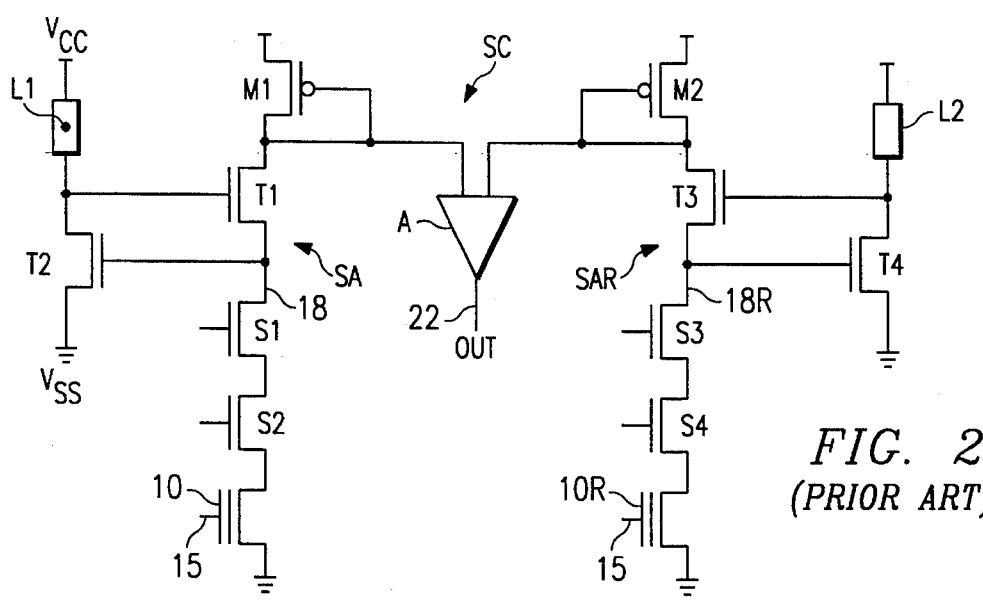
FIG. 2 illustrates a prior-art sensing circuit.

FIG. 2 illustrates a typical prior-art sensing circuit SC for a nonvolatile memory. Such circuits generally use a form of "single-ended" current-sensing of both the current through the source-drain path of an array cell 10 and the current through a single static reference cell 10R, which may be in a column of such reference cells 10R. Usually, a memory-side sense amplifier SA (M1, T1, T2, L1) is used to sense the current in the array cell 10 through column-select transistors S1 and S2. A reference-side sense amplifier SAR (M2, T3, T4, L2) is used to sense the current in a reference-current source, such as a particular reference cell 10R, through column-select transistors S3 and S4. Voltages directly related to the two currents are compared by differential amplifier A. The output of differential amplifier A indicates at terminal 22 whether or not the cell 10 being read is programmed with a "0" or a "1". Optional transistors T1–T4 and loads L1–L2 are known in the prior-art and are used to cut off current flow at low values of read current.

To achieve satisfactory operation in such prior-art sensing circuitry SC of the type shown in FIG. 2, the current sense amplifiers SA and SAR are usually unbalanced. That is transistors M 1 and M2 ratio current such that the current through transistor M2 is, for example, equal to twice the current through transistor M1. The predetermined ratio (two-to-one, for example) is realized by the well-known practice of forming the respective source-drain paths of transistors M1 and M2 with proper relative length and width dimensions. For example, transistor M2 may have a channel that is the same length as that of transistor M1 but is twice the width to provide a two-to-one ratio of current between transistors M2 and M1. If the source-drain dimensions of transistors M 1 and M2 are the same, another method must be used to cause the current and/or voltage associated with the reference-current source to differ from the current and/or voltage associated with the array cell 10 to ensure the integrity of the read-operation data.

Many variations of the circuit of FIG. 2 are used. Some of those variations, such as that described in the Nakai reference cited earlier herein, utilize equalization to attempt to correct performance degradation caused by the problems resulting from imbalance between the reference and data side of the circuit. In general, however, the imbalances are a natural consequence of the circuit architecture.

Figure 3:
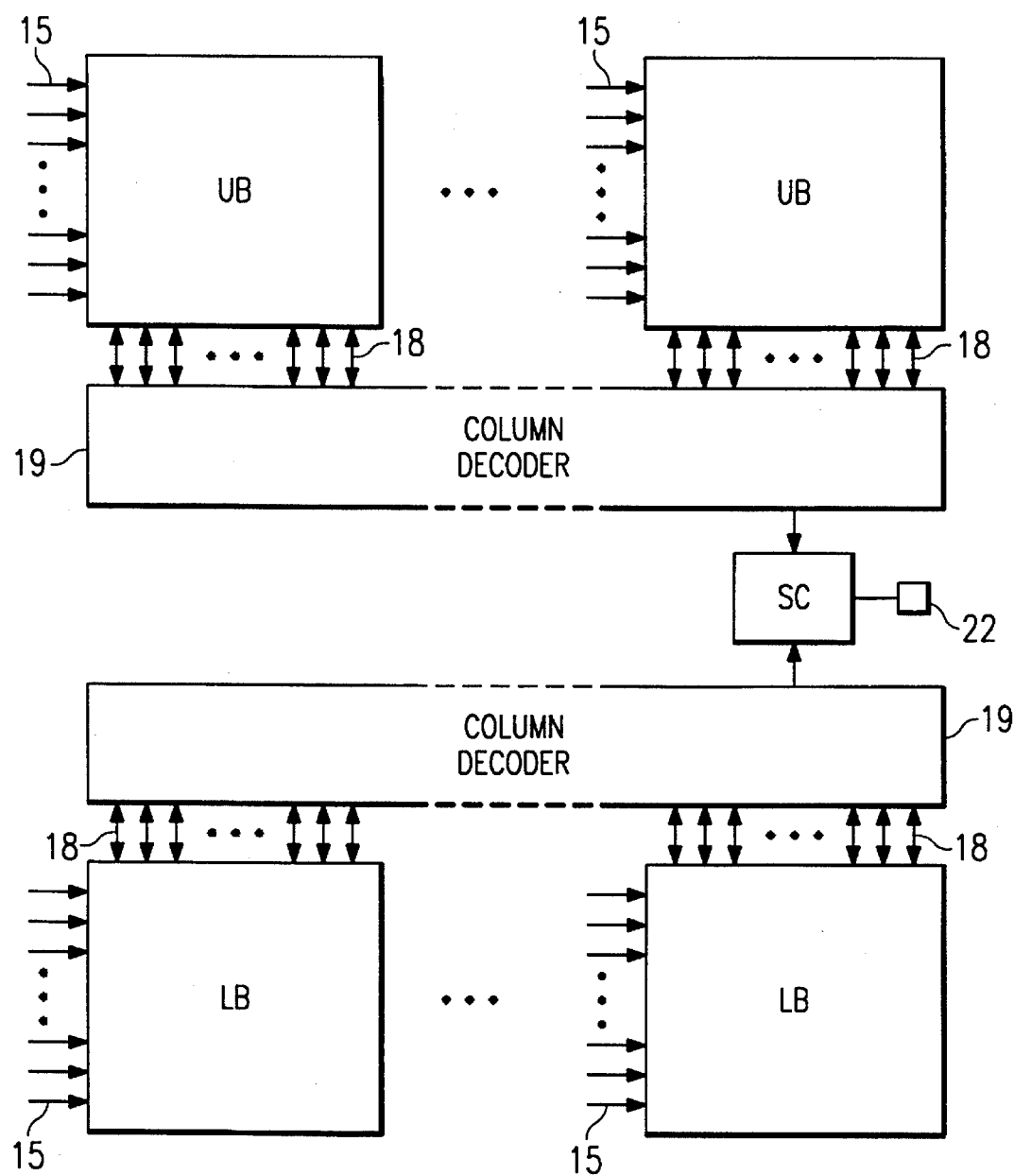
FIG. 3 illustrates a partitioned nonvolatile memory array.

As the density of memory arrays increases, it is generally convenient to partition such arrays in a manner such as that illustrated in FIGS. 1 and 3. FIG. 3, in particular, illustrates partition of a nonvolatile array into upper blocks UB and lower blocks LB of cells 10. Such partitioned arrays may have several rows and columns of blocks, or segments, of cells 10.

Figure 4:
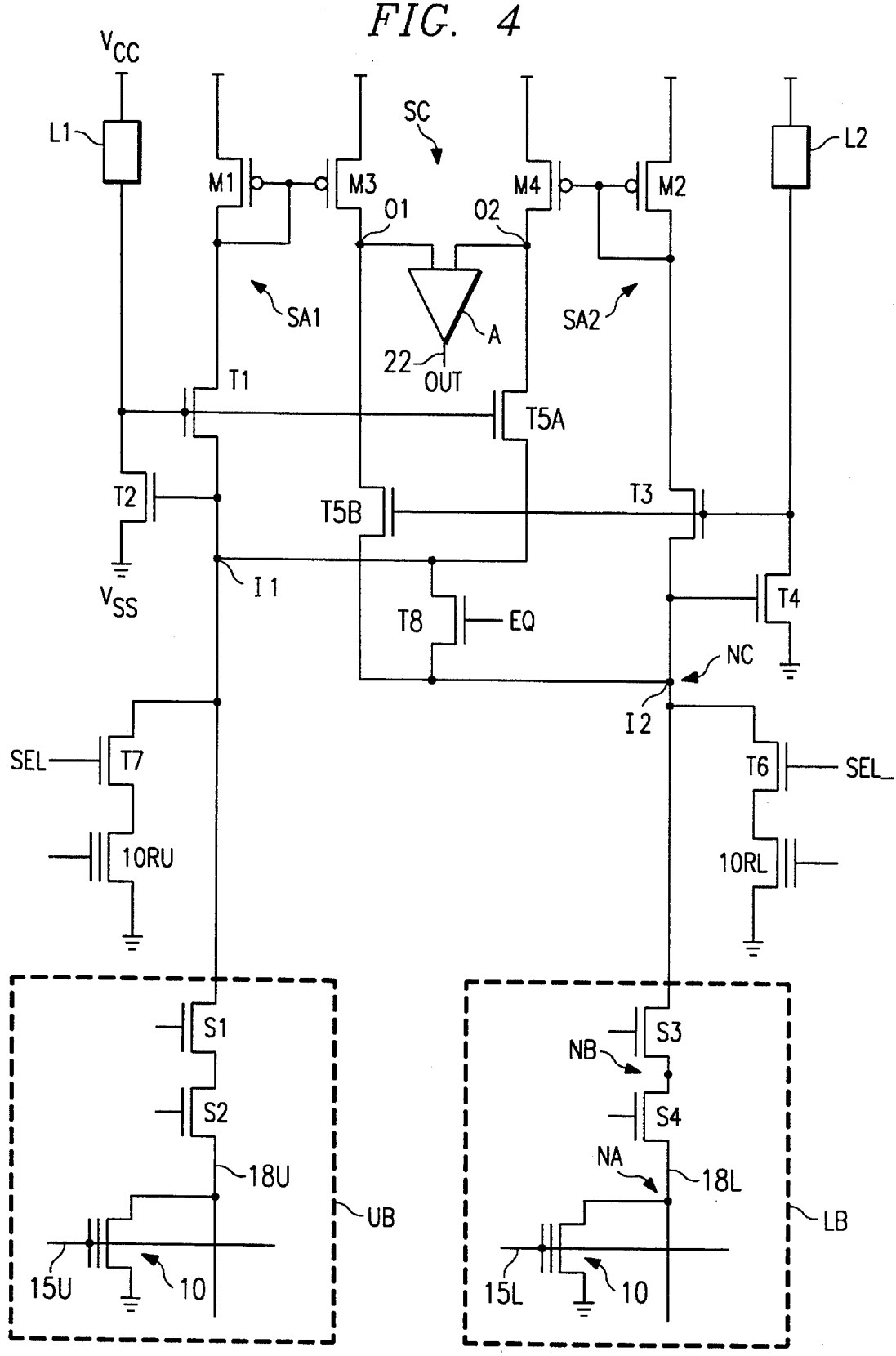
FIG. 4 illustrates a functional arrangement of the circuit of this invention.

The partitioning of memory arrays allows use of balanced sensing circuitry for better performance, as illustrated in FIG. 4. In one mode of operation of the circuit of FIG. 4, the first sense amplifier SA1 (M1, M3, T1, T2, L1) is used to sense the current in a cell 10 in, for example, an upper block UB of the array through column-select transistors S1 and S2. The second sense amplifier SA2 (M2, M4, T3, T4, L2) is used to sense the current in reference circuitry 10RL through transistor T6 activated by signal SEL__. The circuit of FIG. 4 includes enabling transistors T5A and T5B, which act in concert with transistors T2 and T3 of both FIG. 4 and prior-art FIG. 2. It is noted that in the reference circuitry is represented by a single reference cell 10RL here, but may consist of multiple reference cells and mirror circuitry as described in copending U.S. patent application Ser. No. 08/308,022, filed Sep. 16, 1994. The second sense amplifier SA2 also senses through activation of column-select transistors S3 and S4 capacitance-charging current in, for example, a lower block LB of the array identical to the upper block UB. The wordlines 15L in the lower block LB of the array are biased to prevent conduction through any of the cells 10 in that lower block LB. Voltages directly related to the two currents are compared by differential amplifier A.

In a second mode of operation, the current through a cell 10 in lower block LB is compared with the current from reference circuitry 10RU and transistor T7, which is activated by signal SEL. Operation is identical to that described above.

The first sense amplifier of FIG. 4 includes a pair of P-conductivity-type current-mirror transistors M1 and M3 in which field-effect transistor M3 mirrors the current through load mirror transistor M1. Current-mirror transistors M1 and M3 each have a commonly-connected source-drain electrodes and have gates connected to each other. The commonly-connected source-drain electrodes of transistors M1 and M3 are connected to supply-voltage source VCC. The second sense amplifier includes identical circuitry.

The balanced sensing circuitry of FIG. 4 is shown in a functional arrangement. However, the circuit of FIG. 4 may be physically arranged in a balanced, or symmetrical, configuration. For most effective sensing, the circuitry is designed to include balanced mirror circuits (i.e., M1=M2 and M3=M4). This means that, in order to sense an erased cell 10 on the upper drain-column line 18U of an upper block UB, a reference-current source is needed on the lower drain-column line 18L that conducts approximately one-half as much current as an erased cell 10. A way to accomplish this is discussed in U.S. patent application Ser. No. 08/308, 022, filed Sep. 16, 1994. That U.S. patent application is hereby expressly incorporated herein. Ideally, this reference-current source is connected to the lower drain-column line 18L at node NA (for sensing data in the upper block of the array), but the reference-current source may be connected to node NB or node NC with little compromise in performance. A counter-balancing reference-current source is preferably provided on the upper block UB of the array for sensing data from the lower block LB of the array. With this method, data is sensed very quickly after the signal of transistor T8 goes low, provided the voltages on the selected wordline 15U or 15L and selected column-line 18U or 18L have reached a final transient value. In the event of misalignment between the wordline 15 and column-line 18U or 18L selection and the signal at terminal EQ, the circuitry fully recovers and, in fact, may be used (though to lesser advantage) without equalization.

The signal at the EQ terminal is, for example, derived from an address transition detector (not shown) or from an external clock signal. During operation, the upper and lower column-line select transistors S1, S2, S3 and S4 are operated identically, but only one wordline 15U or 15L is activated. If an upper wordline 15U is selected, a reference-current source is activated in the lower part LB of the array. Conversely, if a lower wordline 15L is selected, a reference-current source is activated in the upper part UB of the memory array.

In addition to faster speed of operation, an advantage of the balanced circuitry is improved rejection of, or immunity to, on-chip-generated noise due to better common-node rejection ratio.

In summary, this application discloses sense amplifier circuitry for a memory array, the circuitry including a differential amplifier A having a first input O1 and a second input O1. A first sense amplifier SA1 has an input 11 and an output O1, the output O1 of the first sense amplifier SA1 is coupled to the first input O1 of the differential amplifier. A second sense amplifier SA2 has an input 12 and an output O2. The input 12 of the second sense amplifier SA2 is coupled to the output O1 of the first sense amplifier SA1 and the output O2 of the second sense amplifier SA2 is coupled to said second input O2 of the differential amplifier A and to the input 11 of the first sense amplifier SA1. A reference circuit is coupled to said input 11 of the first sense amplifier SA1. The first sense amplifier SA1 and the second sense amplifier SA2 include identical mirror transistor circuits M1–M4.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. Sense amplifier circuitry for a memory array, said circuitry comprising:

a differential amplifier having a first input and a second input;

a first sense amplifier having an input and an output, said output of said first sense amplifier coupled to said first input of said differential amplifier;

a second sense amplifier having an input and an output, said input of said second sense amplifier coupled to said output of said first sense amplifier, said output of said second sense amplifier coupled to said second input of said differential amplifier and to said input of said first sense amplifier; and a reference circuit coupled to said input of said first sense amplifier;

said first sense amplifier and the second sense amplifier including identical mirror transistor circuits.

2. The circuitry of claim 1, wherein said integrated-circuit memory further includes floating-gate-type memory cells.

3. A sensing circuit having a supply terminal, first and second inputs and first and second outputs, comprising:

- a first transistor having first and second path terminals and a control terminal, said first path terminal of said first transistor coupled to said supply terminal, said control terminal of said first transistor coupled to said second path terminal of said first transistor;
- a second transistor having first and second path terminals and a control terminal, said first path terminal of said second transistor coupled to said supply terminal, said control terminal of said second transistor coupled to said second path terminal of said second transistor;
- a third transistor having first and second path terminals and a control terminal, said first path terminal of said third transistor coupled to said supply terminal, said control terminal of said third transistor coupled to said control terminal of said first transistor and to said first input of said sensing circuit and to said second output of said sensing circuit; and
- a fourth transistor having first and second path terminals and a control terminal, said first path terminal of said fourth transistor coupled to said supply terminal, said control terminal of said fourth transistor coupled to said control terminal of said second transistor and to said second input of said sensing circuit and to said first output of said sensing circuit.

4. The sensing circuit of claim 3, further comprising fifth and sixth transistors, each having first and second path terminals and an enabling terminal, wherein said first path terminal of said fifth transistor is coupled to said second path terminal of said first transistor, said second path terminal of said fifth transistor coupled to said first input of said sensing circuit, said first path terminal of said sixth transistor coupled to said second path terminal of said fourth transistor, said second path terminal of said sixth transistor coupled to said first input of said sensing circuit, said enabling terminal of said sixth transistor coupled to said enabling terminal of said fifth transistor.

5. The sensing circuit of claim 4, wherein said enabling terminal of said fifth transistor is coupled to a load circuit.

6. The sensing circuit of claim 3, further comprising fifth and sixth transistors, each having first and second path terminals and an enabling terminal, wherein said first path terminal of said fifth transistor is coupled to said second path terminal of said second transistor, said second path terminal of said fifth transistor coupled to said second input of said sensing circuit, said first path terminal of said sixth transistor coupled to said second path terminal of said third transistor, said second path terminal of said sixth transistor coupled to said second input of said sensing circuit, said enabling terminal of said sixth transistor coupled to said enabling terminal of said fifth transistor.

7. The sensing circuit of claim 6, wherein said enabling terminal of said fifth transistor is coupled to a load circuit.

8. The sensing circuit of claim 3, further including a differential amplifier having first and second inputs and an output, wherein said first and second outputs of said sensing circuit are respectively coupled to said first and second inputs of said differential amplifier.

9. The sensing circuit of claim 3, further including a reference terminal and a reference nonvolatile cell having first and second path terminals, wherein said first input of said sensing circuit is coupled said first path terminal of said reference nonvolatile cell and said reference terminal is coupled to said second path terminal of said reference nonvolatile cell.

10. The sensing circuit of claim 3, further including a reference terminal and an array nonvolatile cell having first and second path terminals, wherein said second input of said sensing circuit is coupled said first path terminal of said array nonvolatile cell and said reference terminal is coupled to said second path terminal of said array nonvolatile cell.

11. The sensing circuit of claim 3, further including an enabling terminal and a fifth transistor having first and second path terminals and a control terminal, wherein said first path terminal of said fifth transistor is coupled to said first output of said sensing circuit, said second path terminal of said fifth transistor is coupled to said second output of said sensing circuit, and said control terminal is coupled to said enabling terminal.

12. The sensing circuit of claim 3, wherein said transistors have the same channel dimensions.

13. A sensing circuit for sensing difference in current flow between a reference memory cell and an array memory cell, said sensing circuit having a supply terminal, first and second inputs and first and second outputs, comprising:

- first and second current mirrors, each said current mirror having a current mirror input and a current mirror output, each said current mirror further comprising:
  - a first transistor having first and second path electrodes and a control electrode, said first path electrode of said first transistor coupled to said supply terminal, said second path electrode coupled to said current mirror input, said control terminal of said first transistor coupled to said second path terminal of said first transistor;
  - a second transistor having first and second path electrodes and a control electrode, said first path electrode of said second transistor coupled to said supply terminal, said second path electrode coupled to said current mirror output, said control terminal of said second transistor coupled to said control electrode of said first transistor;
- said current mirror output of said first current mirror coupled to said current mirror input of said second current mirror and to said first output of said sensing circuit;
- said current mirror output of said second current mirror coupled to said second output of said sensing circuit and to said current mirror input of said first current mirror;
- said current mirror input of said first current mirror coupled to one of said reference and said array cell; and
- said current mirror input of said second current mirror coupled to the other of said reference and said array cell.

14. The sensing circuit of claim 13 further comprising a differential amplifier having first and second inputs and an output, wherein said first and second outputs of said sensing circuit are respectively coupled to said first and second inputs of said differential amplifier.

* * * * *